United States Patent
Cranford, Jr. et al.

[11] Patent Number: 6,031,394
[45] Date of Patent: Feb. 29, 2000

[54] LOW VOLTAGE CMOS CIRCUIT FOR ON/OFF CHIP DRIVE AT HIGH VOLTAGE

[75] Inventors: Hayden C. Cranford, Jr., Apex; Stacy J. Garvin, Durham; Geoffrey B. Stephens, Cary, all of N.C.

[73] Assignee: International Business Machines Corporation, Armonk, N.Y.

[21] Appl. No.: 09/004,565

[22] Filed: Jan. 8, 1998

[51] Int. Cl.[7] .................. H03K 19/0175; H03K 19/094; H03K 19/003; H03K 19/00

[52] U.S. Cl. ................................ 326/81; 326/81; 326/80; 326/33; 326/83; 326/58; 326/86; 326/121; 326/57; 326/68

[58] Field of Search .................................. 326/81, 80, 33, 326/83, 58, 86, 121, 57, 68

[56] References Cited

U.S. PATENT DOCUMENTS

| | | | |
|---|---|---|---|
| 4,429,237 | 1/1984 | Cranford, Jr. et al. | 307/450 |
| 4,689,504 | 8/1987 | Raghunathan et al. | 307/449 |
| 4,709,162 | 11/1987 | Braceras et al. | 307/270 |
| 4,752,699 | 6/1988 | Cranford, Jr. et al. | 307/297 |
| 5,266,849 | 11/1993 | Kitahara et al. | 307/475 |
| 5,424,659 | 6/1995 | Stephens et al. | 326/81 |
| 5,440,249 | 8/1995 | Schucker et al. | 326/81 |
| 5,467,031 | 11/1995 | Nguyen et al. | 326/81 |
| 5,477,172 | 12/1995 | Schnizlein | 327/99 |
| 5,578,941 | 11/1996 | Sher et al. | 326/34 |
| 5,583,454 | 12/1996 | Hawkins et al. | 326/81 |
| 5,604,449 | 2/1997 | Erhart et al. | 326/81 |
| 5,736,869 | 4/1998 | Wei | 326/81 |
| 5,818,257 | 10/1998 | Villa | 326/81 |

*Primary Examiner*—Michael Tokar
*Assistant Examiner*—James H. Cho
*Attorney, Agent, or Firm*—John D. Flynn; Morgan & Finnegan, LLP

[57] ABSTRACT

A low voltage CMOS circuit and method provide output current ability meeting multimode requirements of high voltage off-chip drivers while protecting the CMOS devices from various breakdown mechanisms. The circuit and method utilize intermediate voltages between two power rails and voltage division techniques to limit the voltages to acceptable limits for drain-to-source, gate-to-drain, and gate-to-source of CMOS devices in any chosen technology. The circuit comprises first and second CMOS cascode chains connected between a high voltage power rail, e.g 5 volt and a reference potential power rail, e.g. ground. Each CMOS cascode chain comprises first and second p-type MOS devices in series with first and second n-type MOS devices. An input circuit is coupled to a node at the midpoint of the first CMOS cascode chain. A bias voltage, typically 3.3 volts is connected to the NMOS devices in the first and CMOS cascode chains. A second bias voltage is coupled to the PMOS devices in the first and second CMOS cascode chains. An output is provided from the second CMOS cascode chain to a third CMOS cascode chain for purposes of providing sufficient pullup capability to drive an output circuit comprising a fourth CMOS cascode chain between the high and reference potentials without exceeding the breakdown mechanisms for any MOS device in the CMOS cascode chains.

16 Claims, 2 Drawing Sheets

LOW VOLTAGE CMOS CIRCUIT FOR ON/OFF CHIP DRIVE AT HIGH VOLTAGE

BACKGROUND OF THE INVENTION

1. Field of the Invention

This invention relates to semiconductor circuits. More particularly, the invention relates to low voltage CMOS circuits for on/off chip high voltage drive.

2. Description of Prior Art

Often times, low voltage CMOS circuits which operate at 3.3 volts must provide higher output voltages which operate at 5.0 volts on or off the same chip. Problems occur when a 3.3 volt chip is connected to higher voltage components. These problems include gate oxide breakdown, hot electron effect, and undesirable reverse leakage. The transistor breakdown can be manifested in at least two forms. The snapback/sustaining voltage occurs when a transistor suddenly transfers from a stable operating point at high drain to source voltage to a lower drain to source voltage at a much higher current. This condition can, under certain conditions, be catastrophic and should be avoided. Another problem is induced stresses causing breakdown condition for MOSFET devices in the gate to drain and the gate to source oxide breakdown voltage. While the snapback/sustaining voltage can be controlled to some extent by using MOSFET's that are two to three times the minimum channel length, there are limits to the use of this technique. The gate to source and gate to drain breakdown voltage limits are not alleviated by this technique. To control these breakdown mechanisms it is necessary to limit all of the aforementioned voltages to the design limits for the particular CMOS technology. For example, it is necessary to limit the drain to source voltage to 3.3 volts or less for technology which is intended for 3.3 volt power supply. Despite the above limitations, it is still desirable to be able to communicate to on or off chip circuits while switching to 5 volt signals without causing breakdown in any of the MOSFET's operating at 3.3 volts.

Prior art related to low voltage CMOS circuits providing higher output voltages include the following:

U.S. Pat. No. 4,709,162 issued Nov. 24, 1987, discloses an off chip driver circuit which includes a pull-up device between an output terminal and a first voltage dropping device diode. A first supply source and a first voltage limiting circuit are connected to the common point between the pull-up device and the voltage dropping diode. The circuit includes means for limiting the voltage at the common point between the voltage dropping diode and the pull-up device to provide high drive to the output terminal without producing excessive stresses in gate oxides and with minimal or no direct current leakage paths.

U.S. Pat. No. 4,429,237 issued Jan. 31, 1984 discloses a pair of FETs connected in series between a potential source and a reference potential. One of the FETs has an input terminal connected to its gate; both of the FETs include a shield surrounding a drain or source diffusion. One of the FETs is connected to the shield of the other and its own shield is connected to a potential source which maybe the potential source connected to the series FETs. This connection aspect provides an FET inverter tolerant of relatively high voltages.

U.S. Pat. No. 4,752,699 issued Jun. 21, 1988 discloses on chip multiple voltage generation using a charge pump and plural feedback sense circuits. A powerdown circuit and a selected feedback path provide a desired voltage level at the output of the charge pump.

U.S. Pat. No. 5,266,849 issued Nov. 30, 1993, discloses a CMOS tri-state buffer circuit which transfers digital signals between a first digital circuit operating at 3.3 volts and a second system operating at 5 volts. Driver clamp circuitry and an n-well voltage controller operate in conjunction with the driver stage to prevent the 5 voltage supply of the second system from interfering with the 3.3 volt system. A clamp line driver transmits signals from the 5 volt system to the 3.3 volt system.

U.S. Pat. No. 5,424,659 issued Jun. 13, 1995, discloses a tri-state buffer circuit for mixed voltage applications. The circuit uses a floating n-well technique in combination with a pass-gate network, a one-shot circuit, and a process-dependent bias voltage reference. The buffer circuit allows CMOS circuits to interface with bus interfaces with higher voltage components, for example, 5 volt peripheral transceiver chips without undesirable reverse leakage currents associated with prior art buffer circuits U.S. Pat. No. 5,440,249 issued Aug. 8, 1995, discloses a voltage translator circuit in which an input signal is level shifted through cascoded transistors and latched by series inverters to drive upper cascoded transistors in an output stage. The logic state of the input signal determines whether the upper cascoded transistors or the lower cascoded transistors in the output stage are activated to set the logic state of the output signal of the voltage level translators circuit.

U.S. Pat. No. 5,467,031 issued Nov. 14, 1995, discloses a 3.3 volt CMOS tri-state driver capable of driving a common 5 volt line. A PMOS pull-up transistor and an NMOS pull-down transistor are connected to an output terminal. The pull-up transistors is formed in and has a substrate terminal that is connected to an n-well. A switching transistor is controlled to connect the n-well to the power supply. A pass-gate transistor is biased to turn-off the switching transistor when the voltage at the output terminal is higher than the power supply voltage, the turn-off causing the n-well to float which prevents leakage current from flowing through a semiconductor junction from the output terminals to the n-wells through the pull-up transistor. A shorting transistor is controlled to short the gate of the pull-up transistor to the n-well when the voltage at the output terminal is higher than the power supply voltage, the shorting preventing leakage current from flowing through the channel of the pull-up transistor.

U.S. Pat. No. 5,477,172 issued Dec. 19, 1995, discloses an input buffer which is configurable depending on whether a 5 or 3.3 volt supply voltage is present. The buffer includes two input buffer circuits. Each circuit is connected to a multiplexer in a control circuit. A logic 1 or 0 set in the control circuit selects the proper input of the multiplexer to be outputted as a valid signal depending upon whether the system is operating at 5.0 or 3.3 volts.

U.S. Pat. No. 5,583,454 issued Dec. 10, 1996, discloses a programmable input/output driver circuit including programmable pull-up and pull-down functions. The circuit may be configured into an application having devices powered by a power supply voltage which is substantially larger than the voltage supplying the driver. Additionally, the circuit maybe configured in other applications having devices powered by a power supply voltage substantially similar to the voltage supplying the driver.

None of the above prior art, alone or in combination, discloses or suggests a low voltage CMOS circuit and method of operation which utilizes intermediate voltages and voltage division techniques for multiple CMOS cascode chains between two power rails to provide higher voltages on or off chip whereby the bias voltages for MOS devices in the chains dynamically change to maintain drain to source, gate to drain and gate to source voltages within acceptable limits for device breakdown prevention.

SUMMARY OF THE INVENTION

An object of the invention is a low voltage semiconductor circuit for providing higher output voltages, on or off chip, while maintaining all circuit devices within acceptable junction voltage limits to prevent device breakdown.

Another object is a low voltage CMOS circuit providing high voltage on/off chip drive without exceeding snapback voltages or thin oxide breakdown voltages for circuit devices.

Another object is a low voltage CMOS circuit using multiple cascode chains in cascade for providing high voltage on or off chip drive without device breakdown.

Another object is a low voltage CMOS circuit which limits source to drain voltages to less than a supply voltage for the circuit.

Another object is a low voltage CMOS circuit which dynamically changes bias voltages for all devices to prevent device breakdown in providing high voltage on/off chip drive.

These and other objects, features, and advantages are achieved in a CMOS circuit comprising first, second, third CMOS and a fourth or output cascode chains in cascade connected between a high voltage power rail, for example, 5 volts, and a reference potential power rail, for example, ground. Each CMOS cascode chain comprises first and second p-type MOS devices in series with first and second n-type MOS device. Each device in a chain is designated by parameters (x, y, z) where x (1 . . . 4) is the chain number; y (N or P) is the device type; and z (1 . . . 5) is the device number in the N or P type chain. An input circuit with signal swing between 3.3 volts and a reference potential is coupled to a node NN1 at the mid-point of 1N1 and 1N2 of the first CMOS cascode chain. The node NN1 is further connected to the gates of (2N3 and 3N5) and a CMOS inverter connected between 3.3 volts and a reference potential. The drain of (2N3) is connected to the gate of (1N1). A bias voltage, typically 3.3 volts is connected to the gates of (1N2 and 2N4). A PFET bias voltage, typically 2.3 volts is coupled to the gates of (1P1, 2P3 and 3P5). The gates of (1P2, 2P4 and a pullup device P7) are connected to the gates of the corresponding devices in the adjacent CMOS cascode. A node NP3 is established at the drains of (1P2, a pullup device P7) and the gate of 2P4 are provided as an input to (3P6) for purposes of providing sufficient pull-up to (4P1) to drive the output CMOS cascode chain. An approximate 2.3 bias voltage is provided to the gate of (4P2). A 3.3 bias voltage is provided to the gate of (4N2) and the gate of (4N1) receives the output of the CMOS inverter. An output is taken from a node at the mid-point of the output CMOS cascode chain whereby the output will be at a higher or 5.0 volt level than the input node at 3.3 volts without exceeding the safe operating voltage of the output CMOS devices or the breakdown mechanism for any MOS device in the CMOS cascode chains. In processing a low voltage input signal, the circuit dynamically changes the bias voltage for each device to be within acceptable limits to prevent device breakdown in providing a high voltage output.

DESCRIPTION OF DRAWING

The invention will be further understood from the following detailed description of a preferred embodiment taken in conjunction with the appended drawing, in which.

DESCRIPTION OF PREFERRED EMBODIMENT

Figure 1:
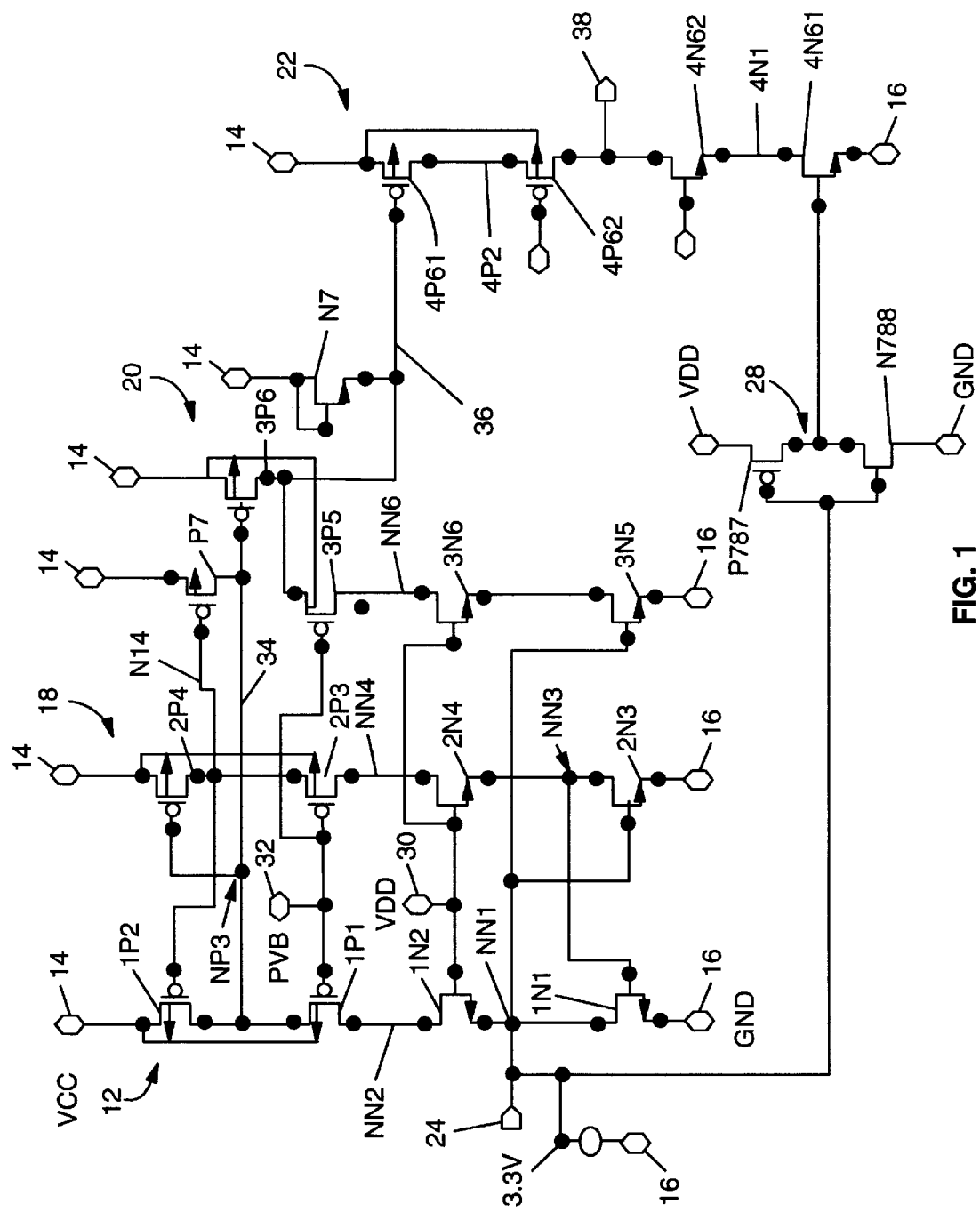
FIG. 1 is a first embodiment of a low voltage CMOS circuit providing higher on or off chip voltages without exceeding the breakdown mechanisms of the circuit devices and incorporating the principles of the present invention.

In FIG. 1, the first embodiment 10 includes a first CMOS cascode chain 12, a second CMOS cascode chain 18 and a third Cmos cascode chain 20, the chains 12, 18 and 20 being in cascade and each MOS device in the chain defined by parameters (x, y, z) where x is (1 . . . 3, the chain number; y is (N or P), the device type; and z can be (1 . . . 5) the device number in the N or P type chain. The cascode chain 12 comprises p-type MOS devices 1P1 and 1P2 in cascode and n-type MOS devices, 1N1 and 1N2 in cascode a serially connected together at a node NN2. The CMOS cascode chain 12 is connected between a high voltage power rail 14 or $V_{cc}$ at 5.0 volts and a low voltage power rail 16 or $V_{ss}$ at ground or 0 volts. The second CMOS cascode chain 18 of like configuration to cascode chain 12 is connected between the power rails 14 and 16 and consists of p-type MOS devices 2P3, 2P4 and n-type MOS devices, 2N3 and 2N4 serially connected together at a node NN4. The third CMOS cascode chain 20 is connected between the high voltage power rail 14 and the low voltage power rail 16 and consists of p-type MOS devices 3P5, 3P6 and 3N5, 3N6 serially connected together at a node NN6.

A fourth or CMOS output cascode chain 22 is connected between the high voltage power rail and the low voltage power rail 16 and comprises p-type MOS devices 4P1, 4P2 in cascode and serially connected to n-type MOS devices 4N1, 4N2 in cascode. An output terminal 38 is connected to the midpoint of the chains and nodes 4N62 and NP62 are established at the midpoint of the N and P type cascode chains, respectively.

An input terminal 24 is connected to a node NN1 at the mid-point of the n-type MOS devices 1N1 and 1N2 and receives an input signal $V_{ss}$ between 3.3 and 0 volt levels. Terminal 24 is further connected as an input to a CMOS inverter 28 consisting of a p-type device 787 and an n-type device 788 connected between the voltage supply $V_{ss}$ and a voltage supply $V_{dd}$ or 3.3 volts.

Returning to the node NN1, a connection is made to the gates of n-type MOS device 2N3 and 3N5. At a node NN3, the drain of 2N3 is connected to the gate of 1N1. A first bias supply 30 is connected to the gates of the n-type devices 1N2, 2N4 and 3N6. The bias supply 30 provides a reference voltage of 3.3 volts. A second bias supply or pvb 32 at 2.3 volts is connected to the gates of 1P1, 2P3 and 3P5.

The gates and drains of the p-type devices 1P2 and 2P4 are cross-coupled and establish a node NP3. An output 34 is taken from the node NP3 and provided as an input to the gate of the p-type MOS device 3P6. A p-type MOS device P7 is connected between the high voltage power rail and the output circuit 34 as a means of turning off p-type device 3P6 which is biased by the voltage appearing at the drain of the p-type device 2P4.

The drain of the p-type device 3P6 provides an output 36 as an input to the gate of p-type device 4P61 in the CMOS output chain 22. An N type MOS device N7 is connected to the output line 36 and to the low voltage power rail and serves as a clamp. The bias supply 32 is coupled to the gate of the p-type MOS device 4P62 and the bias supply 30 is connected to the gate of 4N61. The output of the CMOS inverter 28 is provided as an input to the gate of 4N61. The output terminal 38 and provides a signal level 0/5 volt output level according to the input at terminal 24.

Voltage levels are shown appearing at all the nodes NN1 . . . NN6; NP3 . . . NP6 and NN61, 62 as the input voltage levels switch between 3.3 and 0 volts at the input terminal 24. Likewise, the voltage levels are shown at the gates of all circuit devices as the input signal shifts. The voltage levels at the nodes and gates have been determined from a dynamic simulation of the circuit run on a computer. FIG. 1 demonstrates the bias levels dynamically change for each MOS device as the low voltage input signal changes (0–3.3 v) in providing the high voltage output (0–5), yet none of the source to gate, gate to drain and source to drain voltages exceed 3.3 voltage, the breakdown voltage for a MOS device.

The operation of the circuit 10 will now be described. The input signal at 24 is generated from a CMOS logic circuit (not shown) whose voltage swing is from $V_{ss}$ to $V_{dd}$ or zero to 3.3 volts, respectively. The node NN1 swings from $V_{ss}$ equals 0 volts to $V_{dd}$=3.3 volts. When the node NN1 is at $V_{ss}$, the node NN3 will be pulled through 2N4 to 1 nfet threshold below $V_{dd}$ or about 2.7 volts. When NN1 is driven to $V_{dd}$, the drain of 2N3 will be pulled to $V_{ss}$. NN3 swings between 0 and 2.7 volts, depending on the threshold voltage of 2N4.

The node NN4 will follow node NN3 if NN1 is more than one voltage threshold below $V_{dd}$, due to the conduction of 2N4.

Similarly, as node NN1 swings from $V_{dd}$ to $V_{ss}$, the node NN2 will follow NN1 whenever NN1 is more than one voltage threshold below $V_{dd}$, due to the conduction of 1N2.

As node NN4 is pulled along with NN3 to $V_{ss}$, the node NP4 will be pulled through 2P3 to a voltage level that is one pfet threshold voltage (VTP) above the bias voltage 32 which is set at 3 $V_{tp}$+overdrive below $V_{cc}$=5.0 volt or about 2.3 volts. As the node NP4 is pulled from $V_{cc}$ to 2.3 volts by the conduction of 2N3, 2N4 and 2P3, the gate of 1P2 is turned on, which in turn shuts off 2P4 allowing the node NP4 to be pulled to the limit of one $V_{tp}$ above the bias voltage 32. Accordingly, nodes NP3 and NP4 have voltage swings between 2.3 and 5.0 volts.

Nodes NN2 and NN4 will follow NP3 and NP4, respectively, whenever these nodes are more than 1 $V_{tp}$ above the bias voltage 32 and the series 1N1-1N2 or 2N3-2N4, are turned off. Thus, the nodes NN2 and NN4 will swing from $V_{ss}$ to $V_{cc}$. Accordingly, by connecting n-wells (not shown) for 1P1 and 2P3 to their respective source nodes, NP3 and NP4, then at no time does any PFET node to node voltage exceed the 3.3 voltage rating.

Similarly, no NFET node voltage exceeds 3.3 volts, except for the drain to substrate junction voltage for 1N2 and 2N4. Since the gates of these devices are 3.3 volts, the gate-source, gate-drain, drain-source and gate-channel never exceed 3.3 volts. The drain to P substrate junction is capable of supporting voltages well in excess of 5 volts for typical 3.3 volt technology.

For a proper operation of the CMOS cascode chains 12 and 18, the pull-up devices 1P2 and 2P4 must be overpowered by the 1N1, 1N2, 1P1 and 2N3, 2N4, 2P3 during switching and 1P2 and 2P4 are designed to have larger impedance than the rest of the chain. Thus, to have sufficient pull-up capability from the NP3 or NP4 nodes to drive other nodes in a reasonable delay, these nodes are buffered by 3N5, 3N6 and 3P5 and 3P6 whose outputs are capable of driving directly the off-chip driver 4P61 which can pull the output 38 from $V_{ss}$ (zero volts) to $V_{cc}$ (5 volts) without exceeding the safe operating region of fourth CMOS cascode chain 22. The internal chains 12, 18 and 20 only conduct current while switching and conduct zero current in the quiescent state. The off chip or output driver chain 22 behaves similarly when driving a capacitance load.

A 3.3 volt signal at 4N61 can enable the cascode chain 22 to switch the middle node (NN2, NN4, NN6) and the output terminal 38 through 5 volts without exceeding the safe operating region of any of the individual transistors in the chain 22. Thus, the input terminal can drive the gate of 4N61 with the 3.3 volt signal and safely pull the output node from 5 volts to $V_{ss}$.

Figure 2:
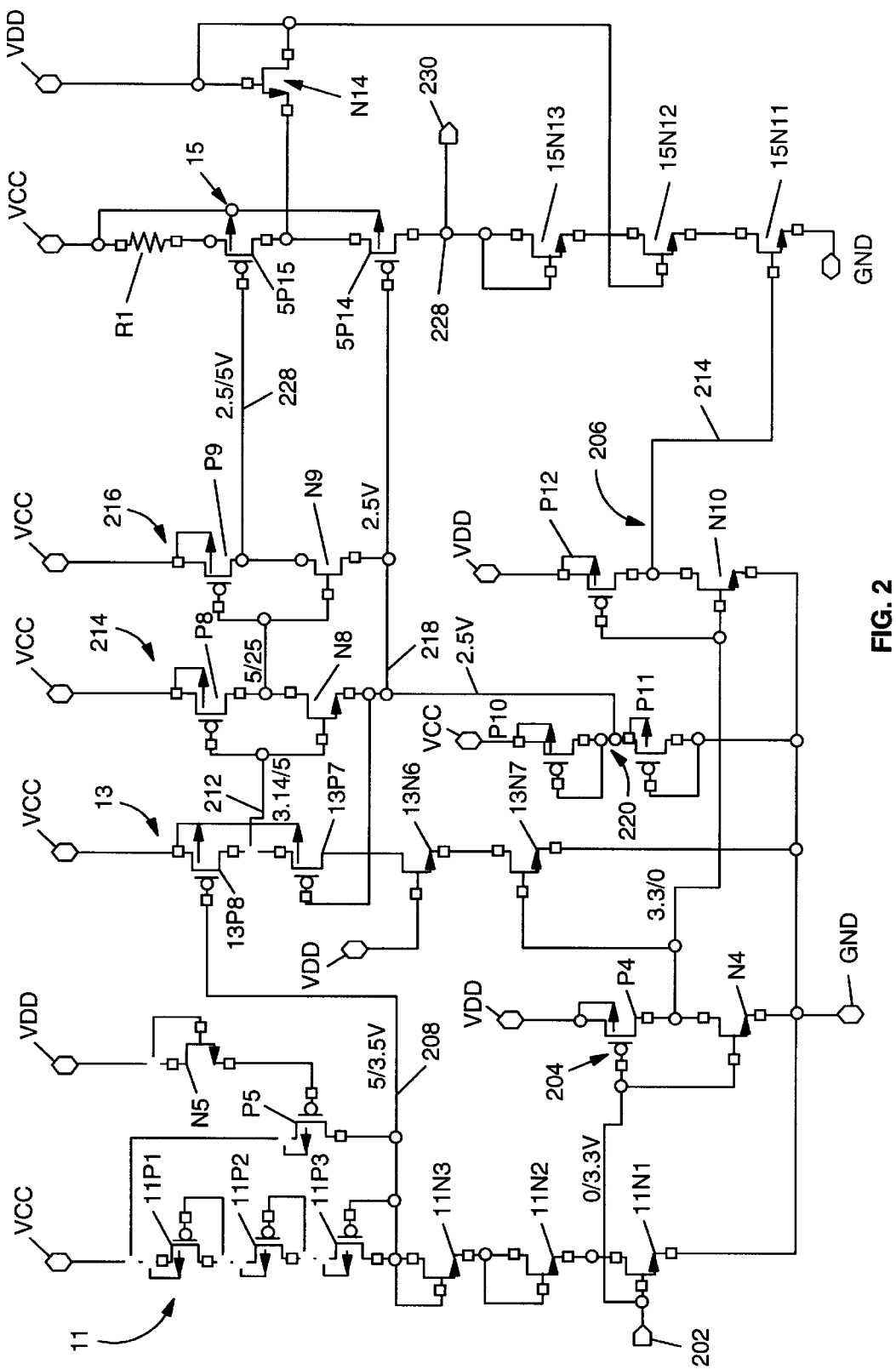
FIG. 2 is a second embodiment of a FIG. 1 providing a correct voltage and current for inserting a token ring device into a ring or while the circuit is in an idle state.

In FIG. 2, the circuit of FIG. 1 has been modified to provide a current output that picks a relay and allows a token ring device to insert into the ring according to the I.E.E.E. 802.5 Specification. The Specification requires the token ring device be inserted into the ring at greater than 4.1 volts and 1 ma current. When a token ring device is not inserted into the ring or the circuit is in an idle state, the circuit should operate at less than 1 volt and 340 micro amps current.

In FIG. 2, a first CMOS cascode chain 11 comprises P-type MOS devices 11P1, 11P2, and 11P3 in series with NMOS devices 11N1, 11N2 and 11N3, the CMOS cascode chain being connected between $V_{cc}$ at 5 volts and a reference potential or ground. The gates of 11P1, 11P2 and 11P3 are connected to their drains. Likewise, the gates of 11N2 and 11N2 are connected to their drains. An input signal 202 is supplied to the gate of the 11N1 device and to the gates of a CMOS inverter 204 comprising PMOS device P4 and NMOS device N4, the output of which is provided to a second CMOS inverter 206 comprising PMOS device P12 and NMOS device N10. The inverters 204 and 206 are connected between $V_{dd}$ which operates at 3.3 volts and a reference potential or ground.

An output 208 is taken from the mid-point of the CMOS cascode chain 201 and provided as an input to a second CMOS cascode chain 13 comprising PMOS devices 13P6 and 13P7 in series with NMOS devices 13N7 and 13N6, the CMOS chain 13 being connected between $V_{cc}$ at 5 volts and ground. The CMOS chain 11 in combination with a PMOS device P5 and an NMOS device N5 serve as a voltage divider to provide either 5 volts or 3.3 volts to the gate of 13P6. The gate of P5 is driven by the source of N5 whose gate and drain are tied together and connected to $V_{dd}$ at 3 volts. The drain of P5 is connected to the output line 208 and the source is connected to $V_{dd}$ at 5 volts.

An output 212 is taken from the mid-point of 13P6 and 13P7 and provided as an input to CMOS inverters 214 and 216 which are in cascade and comprise PMOS device P8, NMOS device N8, and PMOS device P9 and MNOS device N9, respectively. The inverters 214 and 216 are connected between $V_{cc}$ and a reference potential 218 provided by voltage divider 220 comprising PMOS devices P10 and P11 connected in cascade between $V_{cc}$ at 5 volts and ground and providing a reference potential of $V_{cc}/2$ or 2.5 volts. An output 222 from the inverter 216 and an output 224 from the inverter 206 together with the reference potential 218 are provided to a third or CMOS output cascode chain 15 comprising PMOS devices 15P13 and 15P14 in series with NMOS devices 15N11, 15N12 and 15N13. The output 222 is connected to the gate of 15P13 as a P-switch device; the reference potential 218 is connected to the gate of 15P14;

and the output 224 is connected to the gate of NMOS device 15N11 as an N-switch device. The device 15P13 is connected through a load resistor R1 to $V_{cc}$ and the source of 15N11 is connected to ground. $V_{cc}$ is further connected to the sources of 15P13, 15P14. The midpoint between 15P13, 13514 is connected to $V_{dd}$ through the source of an NMOS device N14, the gate and drain of which are connected to $V_{dd}$ and the gate of 15N12. The drain and gate of 15N13 are connected together and a node 228 is established between the PMOS and NMOS cascode chains in the output chain is 226. An output 230 is taken from the node 228. The devices 15N13 and 15P14 maintain a voltage that is equal to $V_{dd}$ minus the threshold at node 228 so that there is no more than 2.5 volts across the device 15P13.

Summarizing, the $V_{cc}$ pins represents 5 volts while the $V_{dd}$ pins represent 3.3 volts and the $V_{ref}$ or ground pins represent $V_{cc}/2$ or 2.5 volts. Devices 11P1-11P13 and 11N1-11N13 provide high voltage breakdown protected logic that controls the output devices load resistor R1, 15P13, 15P14 and 15N11, 15N13. Device 11N1 is a switch that drives the two inverter stages 204 and 206 which control switch devices 13N6 and 15N11. 11N1 also controls the voltage across the voltage divider set up by 11N2, 11N3, N5, 11P1, 11P2, 13P3, P5, which supplies either 5 volts or 2 volts for the gate of 13. 13N7 is a cascode protect device. The voltage divider made by 206 and 220 provide a reference voltage equal to 5 V/2 or nominally 2.5 volts. Inverter stages 214, 216 switch between 5 volts and 2.5 volts.

FIG. 2 shows the bias levels for the gates and nodes which change dynamically as the input signal level changes. In all instances the gate to source, gate to drain and source drain voltages for both the input and output signal levels do not exceed the breakdown voltages of the circuit devices.

When insert occurs at node 202, a node N10 is at 3.3 volts and a node 30 is pulled to 2 volts which enables 13P6 to charge node 90 to 5 volts and discharge a node 100 to 2.5 volts resulting in 5 volts being applied to the P-switch at 15P13. Likewise, node 60 is discharged which disables 13N6 so that there is no discharge path for node 90. An N-switch at 15N11 is charged to 3 volts and the reference potential 218 is always at 2.5 volts. With this conditioning, 15P13 is disabled while 3N11, 15N12, 15N13 are enabled, and the output node 230 is pulled to zero volts. 15P13 and 15P14 maintain a voltage that is equal to $V_{dd}-V_{tn}$ on node 15P13 so that there is no more than 2.5 volts across 15P13. Thus, when a token ring device is inserted into the ring, the circuit will operate at greater than 4.1 volts and 1 ma current satisfying I.E.E.E. 802.5 specification without breakdown of the circuit devices.

When an insert is zero volts, a node 20 is pulled to 5 volts which disables 13P6. The node 90 is discharged to the reference 218 minus $V_{th}$ or around 2 volts. The node 10 charges to 5 volts and the P-switch at 15P13 is set at 2.5 volts. Then N-switch at 15N11 toggles to 3.3 volts. The device 15P13 is now enabled which pulls up the output at 230 towards 5 volts. The chain devices 15N11, 15N12, and 15N13 ensure that there is no destructive differential voltage across any one device. Thus, when a token ring device is not inserted into the ring or the circuit is in an idle state, the circuit will operate at less than 1 volt and 340 micro amps current satisfying the I.E.E.E. 802.5 Specification while protecting the circuit devices from breakdown.

Like FIG. 1, the circuit of FIG. 2 utilizes intermediate voltages and voltage division techniques for CMOS cascode chains to maintain voltages from drain to source, gate to drain, and gate to source, within acceptable limits which prevents breakdown while meeting the insertion requirements of I.E.E.E. 802.5 Specification.

Summarizing the circuits of FIG. 1 and FIG. 2, enable low voltage CMOS circuits which operate at 3.3 volts to provide higher output voltages at 5.0 volts on the same chip without breakdown effect in any of the circuit devices. Moreover, the circuits dynamically change the bias voltages of the devices as the input signal levels switch to implement breakdown protection for the devices. The CMOS cascode chains facilitate intermediate voltages between two power rails utilizing voltage division techniques thereby maintaining drain to source, gate to drain, and gate to source voltages within acceptable limits to avoid breakdown effects.

While the present invention has been described in conjunction with specific embodiments, various changes may be made therein without departing from the spirit and scope of the invention, as defined in the appended claims, in which:

We claim:

1. A low voltage and low current CMOS circuit for providing a high voltage output while protecting the CMOS devices from various breakdown mechanisms, comprising:
   a) a first CMOS cascode chain including PMOS and NMOS devices;
   b) a second CMOS cascode chain including PMOS and NMOS devices and connected in cascade with the first CMOS cascode chain;
   c) means cross coupling the PMOS devices in the first and second cascode chains;
   d) means cross coupling the NMOS devices in the first and second cascode chains;
   e) a third CMOS cascode chain including PMOS and NMOS devices, the PMOS devices coupled to the cross coupled PMOS and the NMOS devices coupled to the cross coupled NMOS devices for buffering the PMOS devices in the first and second cascode chains;
   f) high and low voltage power rails connected to the first, second and third CMOS cascode chains;
   g) an input circuit connected to the first and second CMOS cascode chains and providing low voltage input signal levels;
   h) means coupling the gates of the first, second and third CMOS cascode chains to bias supplies for limiting current flow in the first, second and third cascode chains
   i) a CMOS cascode output circuit including PMOS and NMOS devices and connected between the high and low voltage power rails and to the third CMOS cascode chain, the output circuit providing a high voltage or low voltage output according to the input signal level;
   j) a clamping circuit connected to the PMOS output devices for limiting the maximum voltage across the PMOS output devices; and
   k) means dynamically changing the bias levels of the PMOS and NMOS devices in the first, second, third cascode chains and the output circuit whereby such PMOS and NMOS devices do not exceed their breakdown voltages as the output circuit provides a high or low voltage output.

2. The circuit of claim 1 further comprising:
   a) a first bias supply connected to the NMOS devices in the first and second CMOS cascode chains whereby the voltage across the NMOS devices does not exceed a breakdown voltage for said NMOS devices as the input signal level changes.

3. The circuit of claim 1 further comprising:

a) a second bias supply connected to the PMOS devices in the first and second CMOS chains whereby the voltage across the PMOS devices does not exceed a breakdown voltage for said PMOS devices as the input signal level changes.

4. The circuit of claim 1 further comprising:

a) a third CMOS cascode chain and connected to the first and second CMOS cascode chains for providing pull-up capabilities to the CMOS cascode output circuit.

5. The circuit of claim 1 further comprising:

a) an inverter connected to the input circuit and the CMOS cascode output circuit.

6. The circuit of claim 1 further comprising:

a) first and second inverters in cascade connected to the second CMOS cascade circuit and the CMOS cascode output circuit.

7. The circuit of claim 1 further comprising:

a) first and second inverters connected to the first CMOS cascade circuit and to the CMOS cascode output circuit.

8. The circuit of claim 1 further comprising:

a) means connected to the output of the second CMOS cascade circuit and providing a reference potential between the output high and low voltage levels.

9. The circuit of claim 1 wherein each CMOS cascode comprises:

a) a PMOS cascode circuit in series with an NMOS cascode circuit.

10. The circuit of claim 9 further comprising:

a) a first bias supply connected to the NMOS devices in the first and second CMOS cascode chains whereby the voltage across the NMOS devices does not exceed a breakdown voltage for said NMOS devices as the input signal level changes.

11. The circuit of claim 9 further comprising:

a) a second bias supply connected to the PMOS devices in the first and second CMOS chains whereby the voltage across the PMOS devices does not exceed a breakdown voltage for said PMOS devices as the input signal level changes.

12. The circuit of claim 9 wherein the input circuit is connected to the midpoint between the PMOS and NMOS devices in the first CMOS cascode chain.

13. The circuit of claim 9 further comprising:

a) an output terminal connected to the midpoint between the PMOS and NMOS devices in the CMOS cascode output circuit.

14. The circuit of claim 1 further comprising:

a) a load resistor connected between the high voltage power rail and CMOS cascode output circuit.

15. The circuit of claim 9 wherein the PMOS devices of the first and second CMOS cascode chains are cross-coupled as a pullup device.

16. A low voltage CMOS circuit for providing a current output that picks a relay to allow a token ring device to insert into a ring according to the IEEE 802.5 specification while protecting the CMOS devices from various breakdown mechanisms, comprising:

a) a first CMOS cascode chain including PMOS and NMOS devices;

b) a second CMOS cascode chain including PMOS and NMOS devices and connected in cascade with the first CMOS device cascode chain;

c) means connected to the second cascade circuit for generating a bias supply within the CMOS circuit;

d) high and low voltage power rails connected to the first and second cascade chains;

e) an input circuit connected to the first CMOS cascade chain for receiving a token ring device;

f) a CMOS cascode output circuit including PMOS and NMOS devices and connected between the high and low voltage power rails;

g) a clamping device connected to the output circuit to limit the maximum drain source voltage of the PMOS devices;

h) means connecting the second cascade chain to the PMOS devices in the output circuit as a P switch; and i) means connecting the input circuit to the NMOS devices in the output circuit as an N switch whereby when a token ring device is inserted into the input circuit the output circuit will operate at voltage and current levels satisfying the IEEE 802.5 specification without breakdown of the PMOS and NMOS devices and when the token ring device is removed from the input circuit, the output circuit will operate at different voltage and current levels satisfying the IEEE 902.5 specification without breakdown of the PMOS and NMOS devices.

\* \* \* \* \*